United States Patent [19]

Yazaki

[11] Patent Number: 5,796,272

[45] Date of Patent: Aug. 18, 1998

[54] FREQUENCY DEVIATION DETECTION CIRCUIT

[75] Inventor: Masahiro Yazaki, Tokyo, Japan

[73] Assignee: NEC Corporation, Tokyo, Japan

[21] Appl. No.: 657,596

[22] Filed: May 31, 1996

[30] Foreign Application Priority Data

May 31, 1995 [JP] Japan ................................. 7-132491

[51] Int. Cl.$^6$ ........................................................ H03D 13/00
[52] U.S. Cl. ............................ 327/41; 327/42; 327/43; 327/144; 327/151; 327/292
[58] Field of Search ............................. 327/41–43, 144, 327/151, 292

[56] References Cited

U.S. PATENT DOCUMENTS

| | | | |
|---|---|---|---|
| 5,369,311 | 11/1994 | Wang et al. | 327/292 |
| 5,381,416 | 1/1995 | Vartti et al. | 327/292 |
| 5,578,938 | 11/1996 | Kazami | 327/292 |
| 5,610,561 | 3/1997 | Zarrabian | 327/292 |

FOREIGN PATENT DOCUMENTS

| | | |
|---|---|---|
| 3-102933 | 4/1991 | Japan . |
| 3-99540 | 4/1991 | Japan . |
| 4-157834 | 5/1992 | Japan . |
| 4-260238 | 9/1992 | Japan . |

*Primary Examiner*—Margaret Rose Wambach
*Attorney, Agent, or Firm*—Sughrue, Mion, Zinn, Macpeak & Seas, PLLC

[57] ABSTRACT

A frequency departure detecting circuit permits flexibly modify a detecting condition of frequency departure. A working reference clock is counted for a given period. On the basis of uniformity between bits of given number of upper bits of the counted value, large magnitude of frequency departure of repeated frequency of the reference clock from a frequency that should be is judged. Also, through comparison of given number of lower bits of the counted value and externally set detecting value, departure of the repeated frequency of the reference clock from the frequency that should be, is judged. When the counted value reaches a predetermined value, free running condition of the counter is judged to stop counting operation. When judgement is made that the repeated frequency of the reference clock is departed from the frequency that should be, the working reference clock is replaced with a back-up reference clock in response to an alarm.

10 Claims, 7 Drawing Sheets

FREQUENCY DEVIATION DETECTION CIRCUIT

BACKGROUND OF THE INVENTION

1. Field of the Invention

The present invention relates generally to a frequency deviation detection circuit. More specifically, the invention relates to a circuit for detecting deviation from the desired fixed frequency of a reference clock in a system for establishing a synchronous network.

2. Description of the Related Art

It is important to monitor the frequency of a reference clock in a system for establishing a synchronous network for correct operation of the system.

Figure 5:
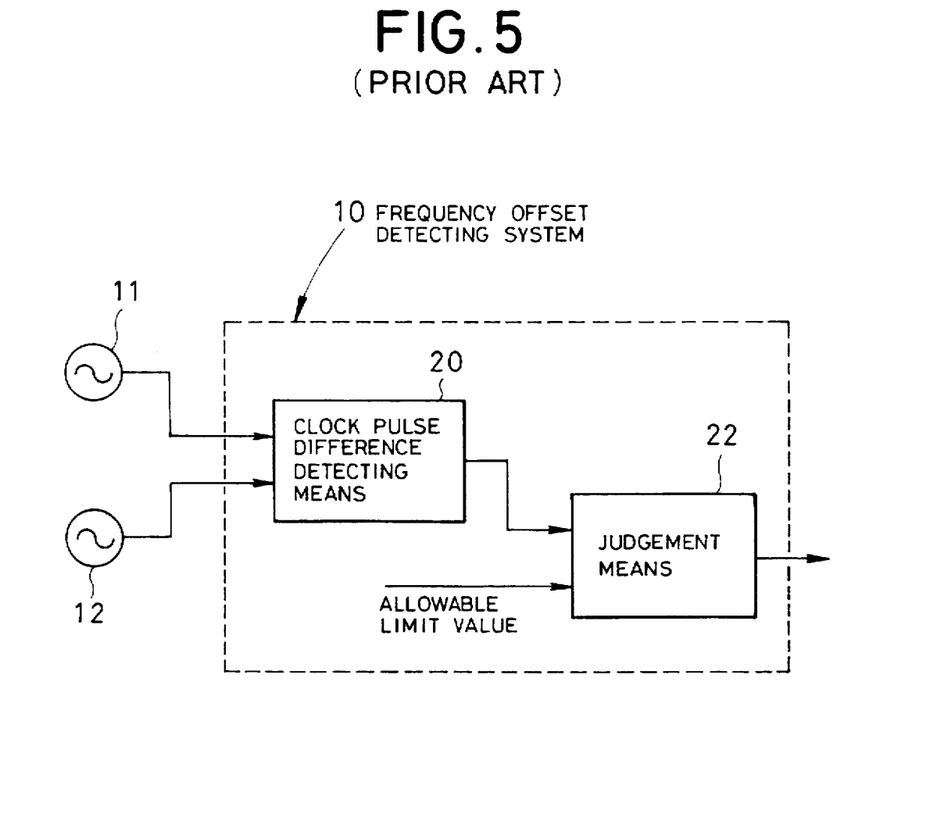
FIG. 5 is an illustration showing the prior art disclosed in Japanese Unexamined Patent Publication No. Heisei 4-260238.

The conventional frequency deviation detection circuit has been disclosed in Japanese Unexamined Patent Publication (Kokai) No. Heisei 4-260238. The circuit disclosed in the above-identified publication has been illustrated in FIG. 5. As shown, the circuit is designed for detecting the frequency offset between two clock source outputs 11 and 12 by using a clock pulse difference detecting means 20 in a frequency offset detecting device 10. When the detected value is not within an allowable limit, a judgment signal is transmitted from a judgement means 22.

Figure 6:
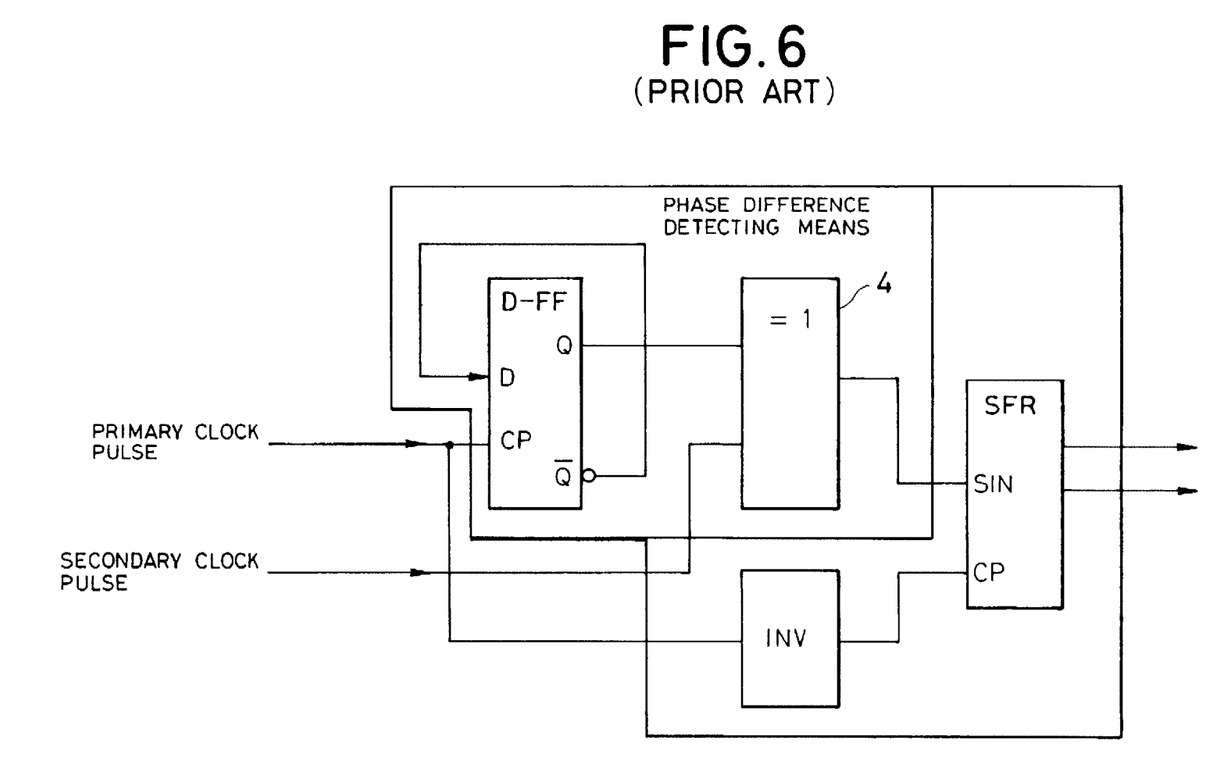
FIG. 6 is an illustration showing the prior art disclosed in Japanese Unexamined Patent Publication No. Heisei 3-99540.

On the other hand, in a circuit disclosed in Japanese Unexamined Patent Publication No. Heisei 3-99540, a phase difference between a primary clock pulse and a secondary clock pulse is detected. This is for detecting the phase difference between the primary clock pulse and the secondary clock pulse using a phase difference detecting means 4 and thereby detecting failure of the clock pulse on the basis of the result of detection, as shown in FIG. 6.

Figure 7:
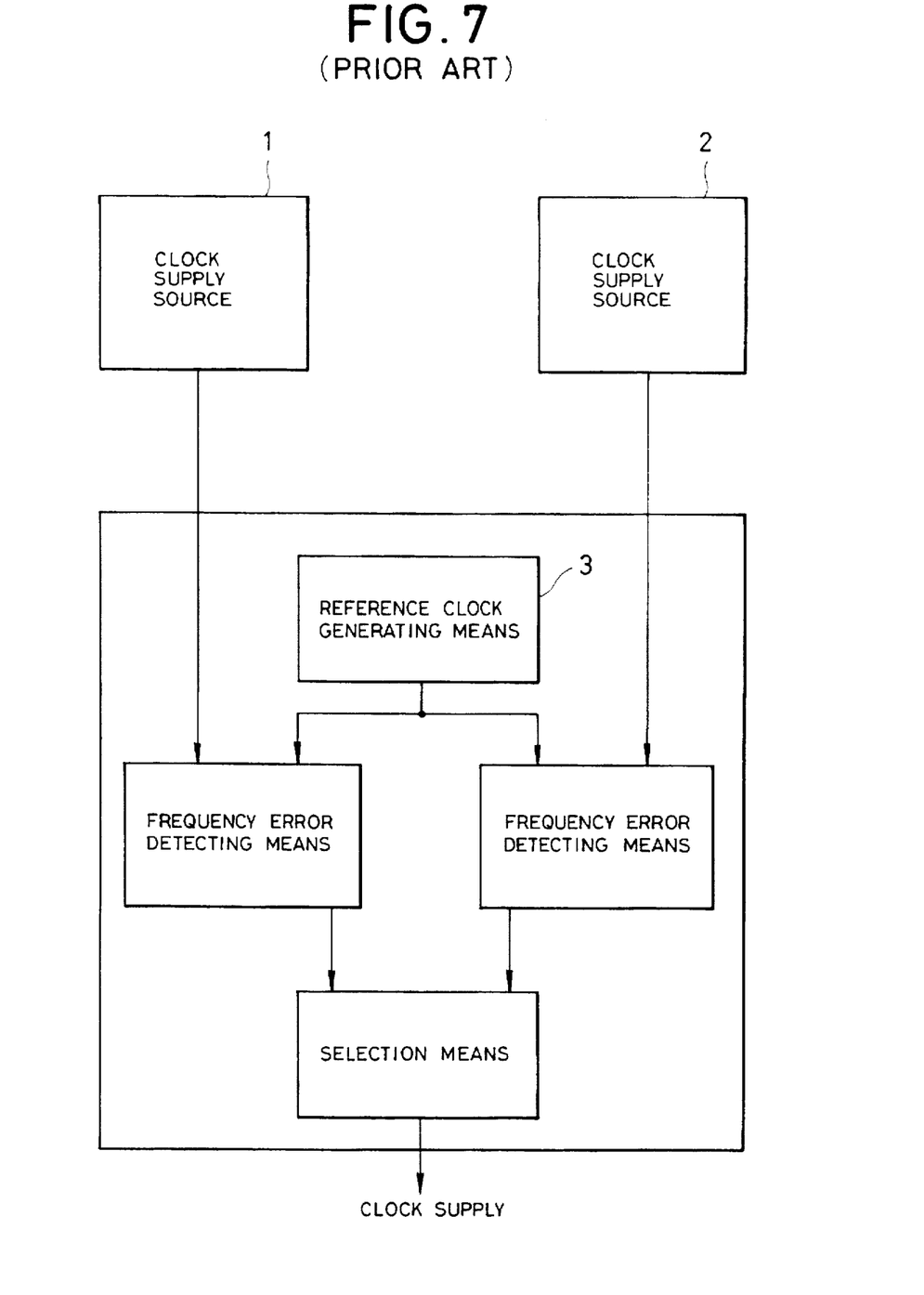
FIG. 7 is an illustration showing the prior art disclosed in Japanese Unexamined Patent Publication No. Heisei 3-102933.

Also, a circuit illustrated in Japanese Unexamined Patent Publication No. Heisei 3-102933 is constructed to detect a frequency difference between clocks respectively input from external clock supply sources 1 and 2 and a reference clock from the internal reference clock generating means 3, as shown in FIG. 7.

Also, in Japanese Unexamined Patent Publication No. Heisei 4-157834, the repeating frequency of two clocks are compared to with the result expressed as a certain data pattern regularity of the data pattern is then monitored. If the data pattern becomes irregular, judgment that the frequencies are offset, is made.

However, in the prior art disclosed in the above-identified publications, the condition for detecting frequency deviation is fixed and cannot be modified at all.

SUMMARY OF THE INVENTION

The present invention has been developed for solving the drawbacks set forth above. Therefore, it is an object of the present invention to provide a frequency deviation detection circuit which is flexible with respect to the conditions necessary for detecting a frequency deviation.

According to one aspect of the invention, a frequency deviation detection circuit comprises:

- a counter for counting the cycles of a working reference clock for a given period;
- a deviation judgment means for determining whether the deviation of the repeating frequency of said reference clock from the desired fixed frequency of said reference clock is within a certain level of tolerance,
- wherein said determination is based upon the uniformity of a given number of the most significant bits of the output of said counter.

According to another aspect of the invention, a frequency departure detecting circuit comprises:

- a counter for counting the cycles of a working reference clock for a given period;
- a departure judgment means for determining whether the departure of the repeating frequency of said reference clock from the desired fixed frequency of said reference clock is within a certain level of tolerance,
- wherein said determination is based upon a comparison between a given number of the least significant bits of the output of said counter and an externally input value.

According to a further aspect of the invention, a frequency deviation detection circuit comprises:

- a counter for counting the cycles of a working reference clock for a given period;
- a first departure judgment means for determining whether the departure of the repeating frequency of said reference clock from the desired fixed frequency of said reference clock is within a certain level of tolerance,
- wherein said determination in said first departure judgment means is upon the uniformity of a given number of the most significant bits of the output of said counter, and
- a second departure judgment means for determining whether the departure of the repeating frequency of said reference clock from the desired fixed frequency of said reference clock is within a certain level of tolerance,
- wherein said determination in said second departure judgment means is based upon a comparison of a given number of the least significant bits of the output of said counter and an externally input value.

The counter may be a down-counter for down counting the reference clock from a loaded value, and the circuit includes loading means for loading a value corresponding to a repeating frequency value of the reference clock at every given period.

In the preferred construction, the frequency deviation detection circuit may further comprise means for stopping the counting operation of the counter when the counted value of the counter reaches a given value. Also, the deviation judgment means may make judgement on the basis of uniformity between bits on the basis of results of an exclusive OR of all of the given number of upper bits of the counted value.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instances well-known structures are not shown in detail in order to not unnecessarily obscure the present invention.

Figure 1:
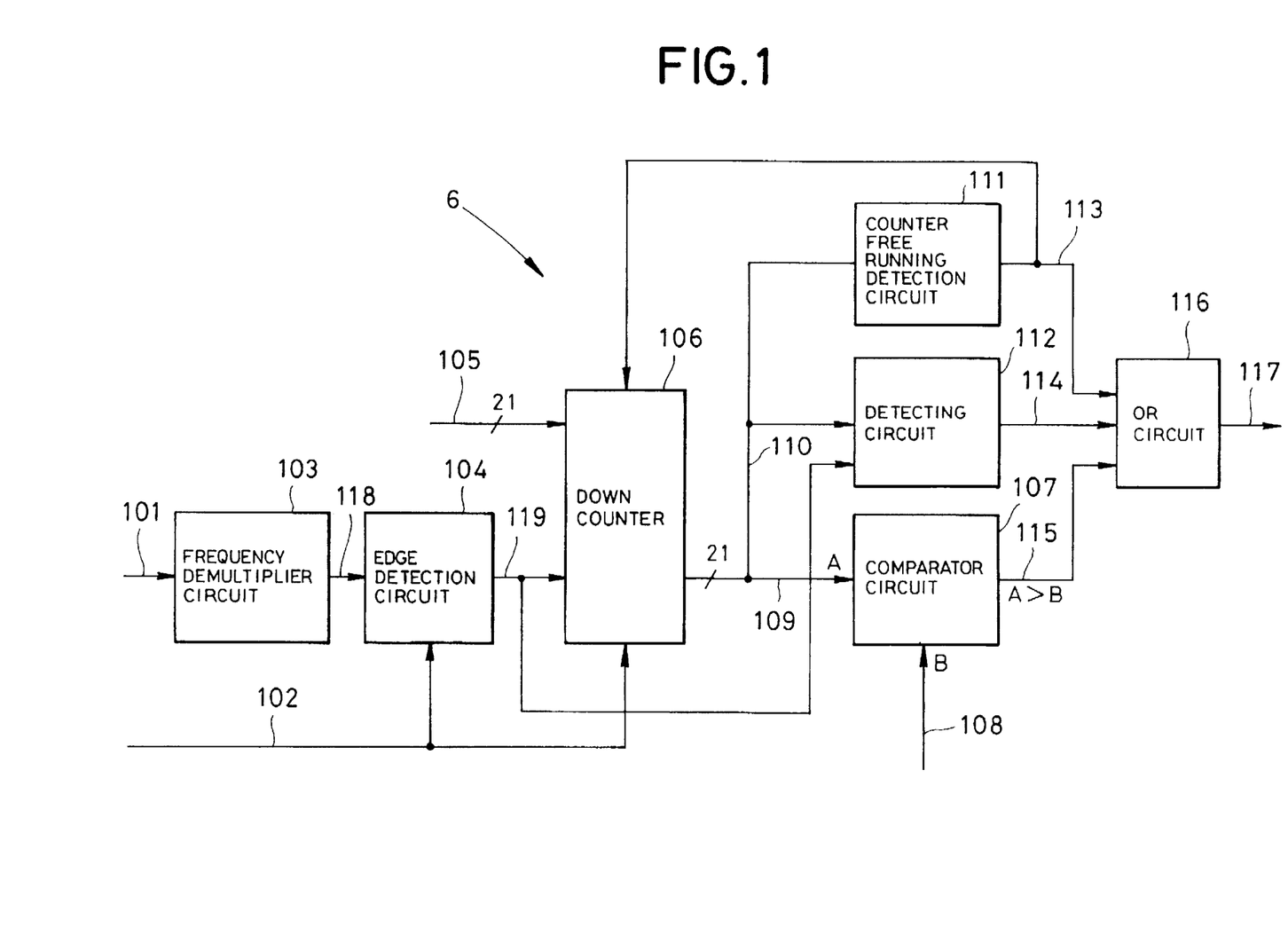
FIG. 1 is a block diagram showing a construction of the preferred embodiment of a frequency deviation detecting circuit according to the present invention.

FIG. 1 is a block diagram showing a construction of the preferred embodiment of a frequency deviation detection circuit according to the present invention. In FIG. 1, the preferred embodiment of a frequency deviation detection circuit 6 according to the present invention, includes a frequency demultiplier circuit 103 outputting clock pulse 118 for detecting period by demultiplying a clock 101, an edge detecting circuit 104 transmitting a load signal 119 by detecting rising edge of the output clock pulse 118 with a reference clock 102, and a down-counter 106 loaded a load value 105 in response to the load signal 119 and count down of from the load value in synchronism with reference clock 102.

On the other hand, the preferred embodiment of the frequency deviation detection circuit 6 according to the present invention, also includes a detection circuit 112 that detects a large magnitude of offset of the repeating frequency employing the upper 12 bits of an output counter value, a comparator circuit 107 detects a small magnitude of offset of the repeating frequency employing the lower 10 bits of the output counter value, a counter free running detecting circuit 111 for detecting free running condition of the down-counter 106 employing the upper 12 bits of the output counter value, and an OR circuit 116 for inputting an alarm from respective circuits.

Figure 2:
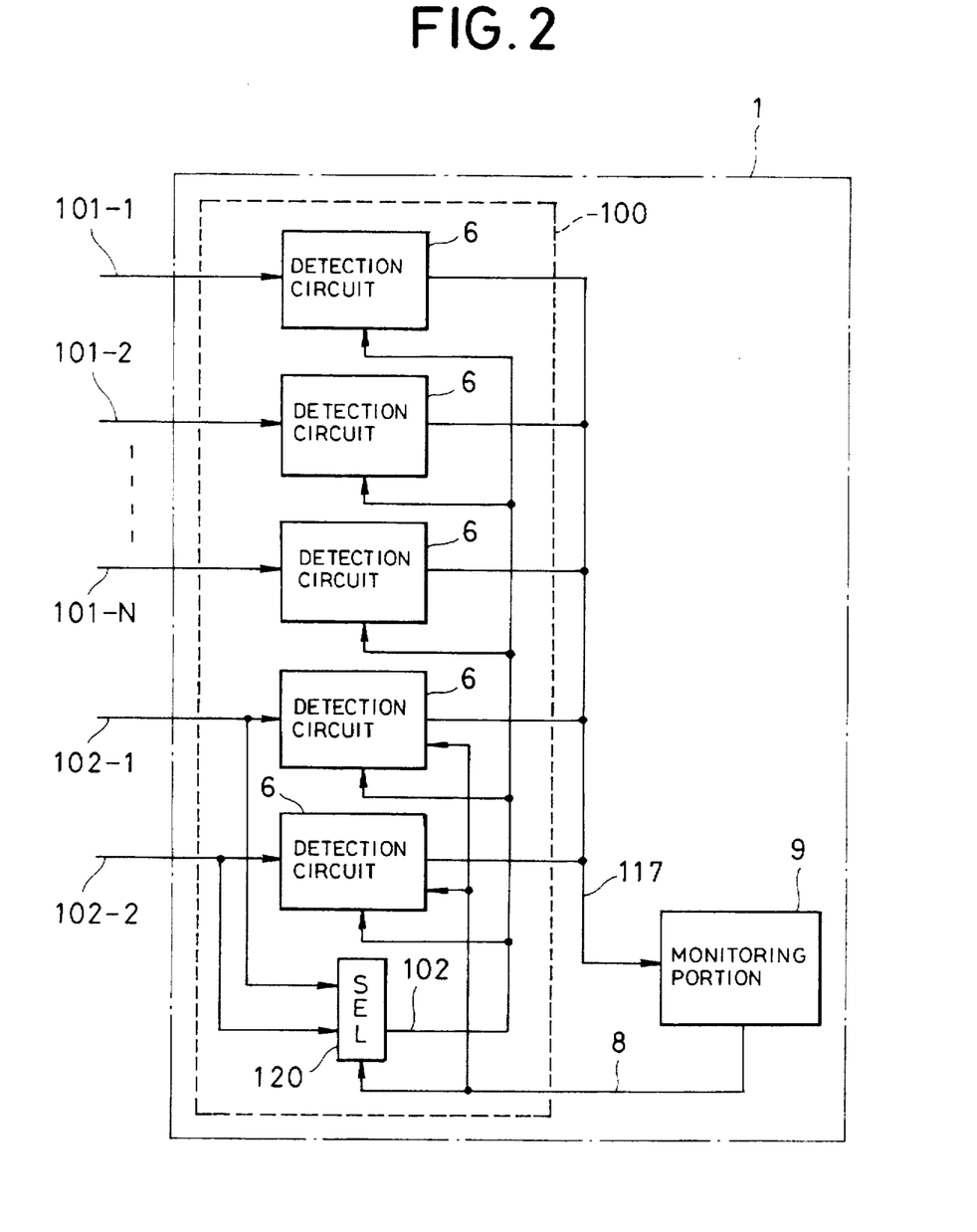
FIG. 2 is a block diagram showing an example of construction of a system for detecting deviation of repeating frequency of a clock employing the preferred embodiment of the frequency deviation detection circuit of FIG. 1.

Next, discussion for a method of use of the preferred embodiment of the frequency deviation detection circuit constructed as set forth above. FIG. 2 is a block diagram showing an example of construction for a system for detecting deviation of repeating frequency of the clock employing the frequency deviation detection circuit of FIG. 1.

FIG. 2, illustrates a system 1 for establishing a synchronous network, a clock 101-1 from a first clock source, a clock 101-2 from a second clock source . . . a clock 101-N from (N)th clock source, reference clocks 102-1 and 102-2. Among the reference clocks 102-1 and 102-2, one is for current use (working) and the other is for back-up. The reference clock is supplied from an oscillator employing a cesium atom oscillator (precision in the order of $1\times10^{-11}$) or a rebidium oscillator (precision in the order of $1\times10^{-10}$).

The clock is input to a detecting portion 100 in the system 1. The frequency deviation detection circuits 6 are provided in the detecting portion 100 corresponding to the respective clocks. In the frequency deviation detection circuit 6, departure of the frequency is detected. The result 117 of detection is reported to a monitoring portion 9 in the system 1.

A selection control signal 8 is transmitted to the detecting portion 100 from the monitoring portion 9. The selector circuit (SEL) 120 is operated by the selection control signal 8. By control of the selector circuit 120, one of the reference clocks 102-1 and 102-2 is input to respective detection circuit 6. It should be noted that the selection control signal 8 also serves as a detection prohibiting signal so that detection of frequency deviation for the currently selected (working) one of the reference clocks 102-1 and 102-2 is not performed.

In such construction, when frequency departure is detected with respect to the working reference clock, the selector circuit 120 is controlled by the selection control signal 8 transmitted from the monitoring portion 9, and is switched to the back-up reference clock.

Figure 3:
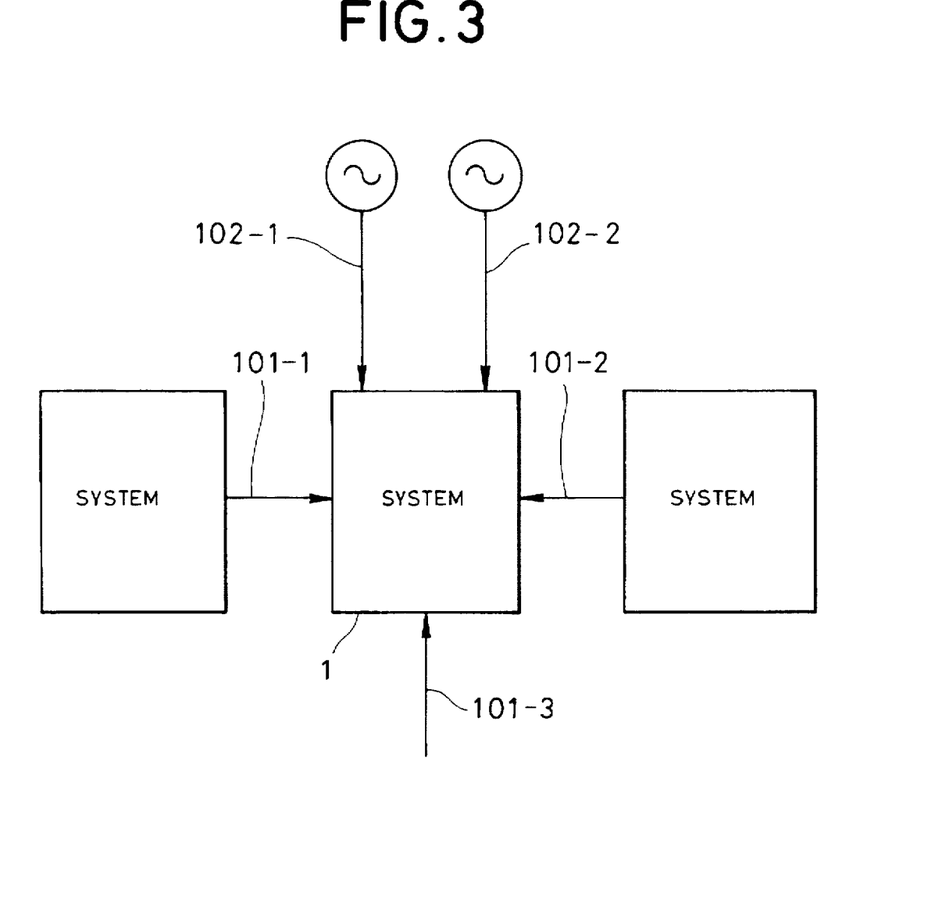
FIG. 3 is a block diagram showing an application of the system of FIG. 1.

On the other hand, the shown system is applicable as shown in FIG. 3, namely, in FIG. 3, a part of a network is illustrated. Like elements to FIG. 1 are identified by like reference numerals.

To the system 1, clocks 101-1 and 101-2 are input from some other system. Furthermore, to the system 1, a clock 101-3 is input from a subscriber system. Namely, FIG. 3 shows the construction in the case where N is "3". Then, the reference clocks 102-1 and 102-2 are input from the external clock sources to the system 1.

Thus, with respect to the system 1 with respect to each clock input externally, the detection of the frequency deviation set forth above is performed.

Returning to FIG. 1, in the construction set forth above, the clock 101 from the external clock source is demultiplied by the frequency demultiplier circuit 103 for generating the clock pulse for period detection.

The generated clock pulse 118 for detecting period is input to the edge detection circuit 104 and the edge thereof is detected by the reference clock 102. One pulse synchronous to the reference clock generated in response to edge detection, is output as the load signal 119 establishing a load input timing to the down-counter 106.

In the down-counter 106, in response to the load signal, counting down of the load value determined preliminarily on the basis of the frequency of the reference clock 102, is initiated. The load value is determined depending upon the repeating frequency value of the reference clock 101, and in the shown embodiment, is the value of 21 bits.

It should be noted that the load value is set to be a value subtracting "1" from the counter value corresponding to the repeating frequency value of the reference clock 102 in consideration of detection error. For example, when the original value corresponding to the repeating frequency value of the reference clock 102 is "FFFF" (H), the load value becomes "FFFE" (H) subtracting "1" from the original value.

The down-counter 106 counts down from the load value in response to the reference clock 102 to continue down-counting until the loading of the next load value. If the final counted value is "0000", a judgment can be made that the repeated frequency is accurate with no frequency departure.

Judgment for frequency departure detection in the shown embodiment is separated into two cases. One is the case where frequency departure is large and the other is the case where frequency departure is small.

A judgment in the case where the frequency departure is large, is performed by using the upper 12 bits of the 21 bits as the output counted value. Namely, when the magnitude of frequency departure is large, the value of the upper 12 bits will never become all "1" or all "0". Thus, the detecting circuit 112 detects large frequency deviations. In addition, by taking exclusive OR of all of the upper 12 bits, uniformity of respective bits of the upper 12 bits can be detected. As a result of detection, when all bits of the upper 12 bits 110 are not "1" or "0", an alarm 114 is transmitted.

On the other hand, the load signal 119 is input to the detecting circuit 112, and uniformity of respective bits can be detected. It should be noted that while the shown embodiment takes the upper 12 bits, number of bits to be used for a making judgment of large magnitude of frequency departure is not limited to the disclosed value, any number of upper bits may be used.

For a judgment of the small magnitude of frequency departure, lower 10 bits among 21 bits as the output of the counted value are used. Here, the lower 10 bits and set detection value 108 are compared by the comparator circuit 107 for detecting large and small relationship. As a result of comparison, if the lower 10 bits is greater, an alarm 115 is transmitted from the comparator circuit 107. It should be noted that while the shown embodiment takes the lower 10 bits, the number of bits to be used for making a judgment of small magnitude of frequency departure is not limited to the disclosed value, any number of lower bits may be used.

Here, it is assumed that the repeating frequency of the reference clock 101 is 1.544 [MHz]. Then, the range to be detected by the lower 10 bits is, since $1 \div (1.544 \times 10^{-6}) = 0.647$ [ppm] per bit, $0.647 \times 1024 = 663$ [ppm]. In the shown embodiment, the magnitude of the frequency departure greater than or equal to this value (i.e. 663 ppm) is taken as large magnitude of frequency departure. If the magnitude of frequency departure is smaller than or equal to this value, a judgment is made that the magnitude of the frequency departure is small. It should be noted that "ppm" means "parts per million" and thus is the unit of one millions.

When the repeating frequency of the reference clock 101 is greater than or equal to the foregoing value, the pitch value has to be increased.

It is possible that the frequency of the clock 101 from the clock source becomes extraordinarily low or the output disappears completely. In such a case, the edges of the clock pulses cannot be detected and thus one cycle of the clock is determined to be in the order of several tens of seconds. In the worst case, the down-counter 106 counts forever.

As a solution for such problem, the shown embodiment employs the counter free running detecting circuit 111 for detecting free running condition of the down counter 106. Then, when the counted value reaches a given value, an alarm 113 is output and the down-counter 106 stops the counting operation.

The alarm 113 of the detecting circuit 111, the alarm 114 of the detecting circuit 112 and alarm of the comparator circuit 107 are input to an OR circuit 116 and then output as the result 117 of detection.

In short, in the shown circuit 6, if the repeating frequency of the reference clock 102 does not offset or departure of frequency is not caused, the number of clock pulses within the detection period corresponds to the frequency of the reference clock. Therefore, if the counted value ends at "0000", a judgment can be made that departure of frequency of the reference clock is not caused.

On the other hand, if the repeating frequency of the reference clock 102 is offset or departure from the frequency, the length of the detection period is changed, and the counted value does not end at "0000". At this moment, the counted value ends at a value other "0000". Then, this value and set detection value 108 are compared by the comparator circuit 107, judgment can be made whether frequency deviation of the reference clock has occurred. It should be noted that in the shown embodiment if the magnitude of the frequency departure is greater than the detection value 108, frequency deviation has occurred is offset. Furthermore, since the detecting value 108 can be arbitrarily modified externally, if frequency departure is desired to be detected precisely, namely it is desired to generate an alarm even at very small deviation magnitude the detecting value 108 may be set accordingly, to a small value. If precise detection of frequency departure is not required, the detecting value may be set to a large value.

When the magnitude of the frequency deviation is large, it can be easily detected only by determining, in the detecting circuit 112 whether all of the upper bits are "0" or "1".

Figure 4:
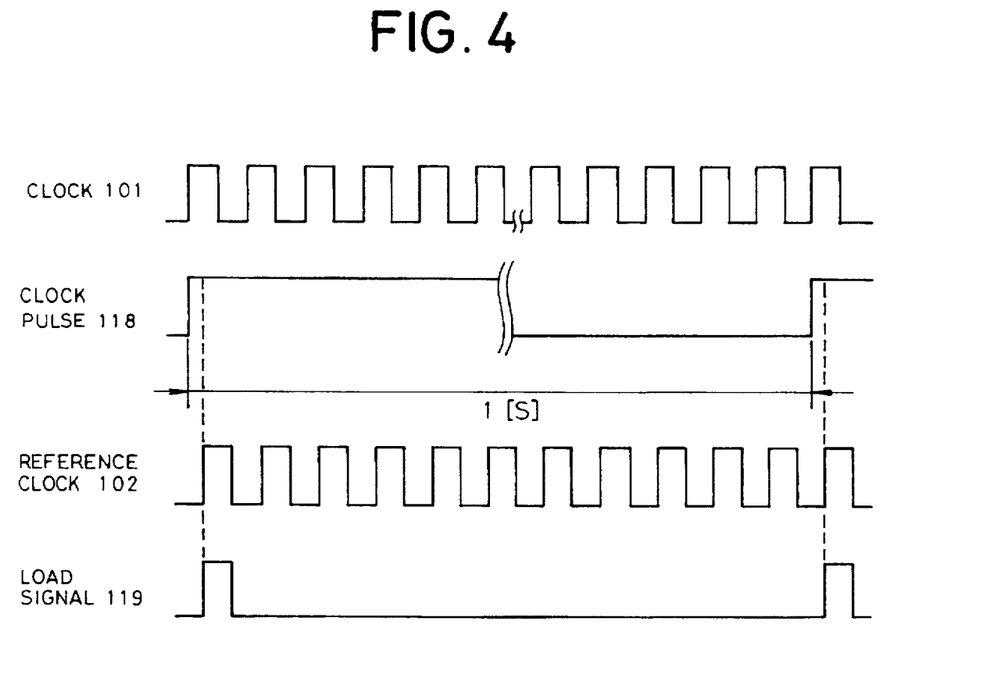
FIG. 4 is a timing chart showing operation of the major part of the preferred embodiment of the frequency deviation detection circuit of FIG. 1.

Next, a discussion will be given for the operation of the major parts of the preferred embodiment of the frequency deviation detection circuit of FIG. 1, with reference to FIG. 4. In FIG. 4, there are illustrated the clock 101, clock pulse 118, the reference clock 102 and the load signal 119. The clock 101 is demultiplied by the frequency demultiplier circuit 103 to be the clock pulse 118 of 1 [s] per one cycle, as shown in FIG. 4. The clock pulse 118 is input to the edge detecting circuit 104. Then, the edge is detected with reference to the reference clock 102. By this, the load signal 119 is generated. Employing the load signal 119, loading to the down-counter 106 is achieved.

As set forth above, by externally modifying the detecting value freely, the detecting condition of the frequency departure can be flexibly modified for varying precision level in detection of the frequency departure. Also, even when large frequency deviations is occur, they can be detected with simple construction.

It should be noted that while the shown embodiment employs the down-counter, it should be obvious that an up-counter may be applicable.

Thus, the frequency deviation detection circuit according to the present invention flexibly permits modification of the detecting condition of the frequency departure by permitting modification of the detecting value externally.

Although the invention has been illustrated and described with respect to an exemplary embodiment simple, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within the scope encompassed and equivalents thereof with respect to the features set out in the appended claims.

What is claimed is:

1. A frequency departure detection circuit comprising:
   a counter for counting a number of cycles of a working reference clock for a given period;
   a departure judgment means for determining whether a departure of a repeating frequency of said working reference clock from a desired fixed frequency of said working reference clock is within a certain level of tolerance, wherein said determination is based upon a uniformity of a given number of the most significant bits of an output of said counter.

2. A frequency departure detection circuit as set forth in claim 1, wherein said counter is a down-counter for down counting said working reference clock from a loaded value and said circuit further comprising loading means for loading said loaded value for each of a plurality of given period boundaries, wherein said loaded value corresponds to the desired fixed frequency of said working reference clock.

3. A frequency departure detection circuit as set forth in claim 1, which further comprises means for stopping said counter when said output of said counter is equal to a given value.

4. A frequency departure detection circuit as set forth in claim 1, wherein said uniformity is determined by an exclusive "OR" function.

5. A frequency departure detection circuit as set forth in claim 1, further comprising means for switching the working reference clock to a back-up clock when a determination is made that the repeating frequency of said working reference clock has departed from the desired fixed frequency of said working reference clock.

6. A frequency departure detection circuit comprising:
   a counter for counting a number of cycles of a working reference clock for a given period;
   a departure judgment means for determining whether a departure of a repeating frequency of said working reference clock from a desired fixed frequency of said working reference clock is within a certain level of tolerance, wherein said determining is based upon a comparison between a given number of least significant bits of an output of said counter and an externally input value.

7. A frequency departure detection circuit as set forth in claim 6, wherein said counter is a down-counter for down counting said working reference clock from a loaded value, said circuit further comprising loading means for loading said loaded value at each of a plurality of given period boundaries, and wherein said loaded value corresponds to the desired fixed frequency of said working reference clock.

8. A frequency departure detection circuit as set forth in claim 6, further comprising means for stopping said counter when said output of the counter is equal to a given value.

9. A frequency departure detection circuit as set forth in claim 6, wherein said departure judgment means bases said determination on a uniformity of all of a given number of most significant bits of said output of said counter, and wherein said uniformity is determined by an exclusive "OR" function.

10. A frequency departure detection circuit comprising:
    a counter for counting a number of cycles of a working reference clock for a given period;
    a first departure judgment means for determining whether a first departure of a repeating frequency of said working reference clock from a desired fixed frequency of said working reference clock is within a certain level of tolerance, wherein said determining in said first departure judgment means is based upon a uniformity of a given number of most significant bits of an output of said counter, and
    a second departure judgment means for determining whether a second departure of the repeating frequency of said working reference clock from the desired fixed frequency of said working reference clock is within the certain level of tolerance, wherein said determining in said second departure judgment means is based upon a comparison of a given number of least significant bits of the output of said counter and an externally input value.

* * * * *